United States Patent
Choi et al.

(10) Patent No.: US 10,910,580 B2
(45) Date of Patent: Feb. 2, 2021

(54) ORGANIC ELECTROLUMINESCENT DEVICE AND DISPLAY INCLUDING THE SAME

(71) Applicant: SAMSUNG DISPLAY CO., LTD., Yongin-si (KR)

(72) Inventors: Eunji Choi, Bucheon-si (KR); Jahyun Im, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 78 days.

(21) Appl. No.: 15/141,896

(22) Filed: Apr. 29, 2016

(65) Prior Publication Data

US 2017/0098782 A1 Apr. 6, 2017

(30) Foreign Application Priority Data

Oct. 5, 2015 (KR) .................. 10-2015-0139840

(51) Int. Cl.
*H01L 51/50* (2006.01)
*H01L 51/00* (2006.01)

(52) U.S. Cl.
CPC ........ *H01L 51/508* (2013.01); *H01L 51/5008* (2013.01); *H01L 51/5076* (2013.01);
(Continued)

(58) Field of Classification Search
CPC ... H01L 51/5072–5096; H01L 51/5096; H01L 51/5008; H01L 51/5076
See application file for complete search history.

(56) References Cited

U.S. PATENT DOCUMENTS

| 6,097,147 A | 8/2000 | Baldo et al. |
| 8,664,643 B2 | 3/2014 | Lee et al. |
| (Continued) | | |

FOREIGN PATENT DOCUMENTS

| CN | 1362747 A | 8/2002 |
| CN | 102044634 A | 5/2011 |
| (Continued) | | |

OTHER PUBLICATIONS

Oyamada, et al. "Extremely low-voltage driving of organic light-emitting diodes with a Cs-doped phenyldipyrenylphosphine oxide layer as an electron-injection layer." Applied Physics Letters 86.3 (2005): 033503.*

*Primary Examiner* — William E McClain
(74) *Attorney, Agent, or Firm* — Lewis Roca Rothgerber Christie LLP

(57) ABSTRACT

An organic electroluminescent device and display, the device including a first electrode; a second electrode on the first electrode; an emission layer between the first and second electrodes; and an electron transport layer between the emission layer and the second electrode, the electron transport layer including a first electron transport layer on the emission layer; a second electron transport layer on the first electron transport layer; and a third electron transport layer on the second electron transport layer, wherein the first electron transport layer includes a first electron transport material, the second electron transport layer includes the first electron transport material, a second electron transport material, and a third electron transport material, the third electron transport layer includes the second electron transport material and the third electron transport material, and the first, second, and third electron transport materials are different from one another.

16 Claims, 9 Drawing Sheets

(52) U.S. Cl.
CPC ...... *H01L 51/0067* (2013.01); *H01L 51/0072* (2013.01); *H01L 51/0077* (2013.01); *H01L 51/5004* (2013.01); *H01L 2251/558* (2013.01)

(56) References Cited

U.S. PATENT DOCUMENTS

| | | | |
|---|---|---|---|
| 2002/0121860 A1* | 9/2002 | Seo | H01L 51/5012 |
| | | | 313/506 |
| 2009/0212688 A1 | 8/2009 | Song et al. | |
| 2011/0084259 A1* | 4/2011 | Lee | H01L 51/5048 |
| | | | 257/40 |
| 2011/0215301 A1* | 9/2011 | Forrest | H01L 51/5036 |
| | | | 257/40 |
| 2013/0200341 A1* | 8/2013 | Fadhel | H01L 51/0072 |
| | | | 257/40 |
| 2014/0103325 A1* | 4/2014 | Shin | H01L 51/0072 |
| | | | 257/40 |
| 2014/0332790 A1 | 11/2014 | Fadhel et al. | |
| 2014/0353649 A1* | 12/2014 | Dorok | H01L 51/005 |
| | | | 257/40 |
| 2015/0340621 A1* | 11/2015 | Parham | H01L 51/0072 |
| | | | 257/40 |
| 2016/0087236 A1 | 3/2016 | Seo et al. | |
| 2016/0104854 A1* | 4/2016 | Jeon | H01L 51/508 |
| | | | 257/40 |
| 2016/0118603 A1* | 4/2016 | Cardinali | C09K 11/06 |
| | | | 257/40 |
| 2016/0322568 A1* | 11/2016 | Fadhel | H01L 51/005 |
| 2017/0005276 A1* | 1/2017 | Kim | C07F 7/081 |
| 2017/0117485 A1* | 4/2017 | Cho | H01L 51/0058 |
| 2017/0373251 A1* | 12/2017 | Hummert | H01L 51/005 |

FOREIGN PATENT DOCUMENTS

| | | | | |
|---|---|---|---|---|
| CN | 104247070 A | 12/2014 | | |
| CN | 104871329 A | 8/2015 | | |
| KR | 10-2012-0010438 A | 2/2012 | | |
| KR | 10-1213497 B1 | 12/2012 | | |
| KR | 10-2015-0012548 A | 2/2015 | | |
| WO | 2014/195482 A2 | 12/2014 | | |
| WO | WO-2015142036 A1 * | 9/2015 | ........... | C07D 403/12 |
| WO | WO-2015142040 A1 * | 9/2015 | ........... | C07D 401/14 |
| WO | WO-2017055264 A1 * | 4/2017 | ........ | H01L 51/5004 |

* cited by examiner

ORGANIC ELECTROLUMINESCENT DEVICE AND DISPLAY INCLUDING THE SAME

CROSS-REFERENCE TO RELATED APPLICATION

Korean Patent Application No. 10-2015-0139840, filed on Oct. 5, 2015, in the Korean Intellectual Property Office, and entitled: "Organic Electroluminescent Device and Display Including Same," is incorporated by reference herein in its entirety.

BACKGROUND

1. Field

Embodiments relate to an organic electroluminescent device and a display including the same.

2. Description of the Related Art

Flat displays are divided into emissive type and non-emissive type. The emissive type includes a flat cathode ray tube, a plasma display panel, and an organic electroluminescent display (or organic light-emitting display, OLED), etc. The OLED, which is an autoemissive type display, may have advantages of broad viewing angle, good contrast, and rapid response rate.

Accordingly, the OLED has been spotlighted, because the OLED may be applied to display for mobile apparatus, e.g., digital camera, video camera, camcorder, personal digital assistant, smartphone, ultrathin laptop, tablet personal computer, or flexible display, or to large electronic products or large electric appliance, e.g., ultrathin television.

The organic light emitting device may realize a color based on a principle in which a hole and an electron injected from first and second electrodes are recombined in an emitting layer to generate an exciton and the exciton generated by recombination of the hole and electron falls from an excited state to a ground state to emit light.

SUMMARY

Embodiments are directed to an organic electroluminescent device and a display including the same.

The embodiments may be realized by providing an organic electroluminescent device including a first electrode; a second electrode on the first electrode; an emission layer between the first electrode and the second electrode; and an electron transport layer between the emission layer and the second electrode, the electron transport layer including: a first electron transport layer on the emission layer; a second electron transport layer on the first electron transport layer; and a third electron transport layer on the second electron transport layer, wherein: the first electron transport layer includes a first electron transport material, the second electron transport layer includes the first electron transport material, a second electron transport material, and a third electron transport material, the third electron transport layer includes the second electron transport material and the third electron transport material, and the first electron transport material, the second electron transport material, and the third electron transport material are different from one another.

The first electron transport material may be a compound that includes a carbazole group and a triazine group.

The first electron transport material may be Compound 1 below:

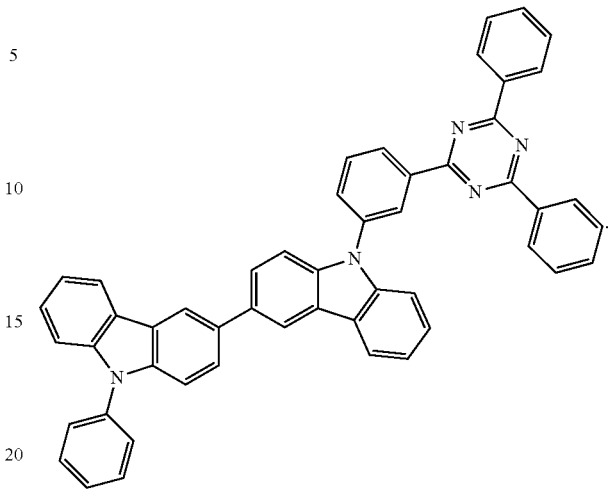

[Compound 1]

The second electron transport material may be a compound that includes a benzoquinoline group and a phosphine oxide group.

The second electron transport material may be Compound 2 below:

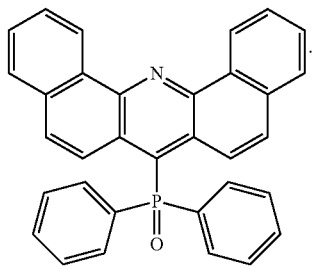

[Compound 2]

The third electron transport material may be one of LiQ, LiF, $Li_2O$, CsF, BaF, BaO, $Al_2O_3$, NaCl, RbCl, RbI, Ca, Cs or Yb.

The first electron transport material and the second electron transport material may satisfy Formula 1 below:

$$[T1-T2]>0.4 \text{ eV} \qquad \text{Formula 1:}$$

wherein: T1 is an energy level of a highest occupied molecular orbital of the first electron transport material, and T2 is an energy level of a highest occupied molecular orbital of the second electron transport material.

The first electron transport layer, the second electron transport layer, and the third electron transport layer may satisfy Formula 2 below:

$$x3>x1>x2 \qquad \text{Formula 2:}$$

wherein: x1 is a thickness of the first electron transport layer, x2 is a thickness of the second electron transport layer, and x3 is a thickness of the third electron transport layer.

The electron transport layer may satisfy Formula 3 below:

$$10<[X1/Y1]\times 100<15 \qquad \text{Formula 3:}$$

wherein: X1 is a total thickness of the electron transport layer, and Y1 is a distance between the first electrode and the second electrode.

A thickness of the first electron transport layer may be about 10% to about 20% of a total thickness of the electron transport layer.

A thickness of the second electron transport layer may be about 1% to about 6% of a total electron transport layer.

One face of the first electron transport layer may contact one face of the emission layer, another face of the first electron transport layer may contact one face of the second electron transport layer, and another face of the second electron transport layer may contact one face of the third electron transport layer.

The organic electroluminescent device may further include a hole transport region between the first electrode and the emission layer, wherein the hole transport region includes: a first hole transport layer on the first electrode; and a second hole transport layer on the first hole transport layer.

The first hole transport layer may include a p-type dopant.

The emission layer may include a first emission layer on the first electrode; a second emission layer on the first emission layer; and a third emission layer on the second emission layer.

The embodiments may be realized by providing an organic electroluminescent display comprising a plurality of pixels, wherein each pixel includes a first electrode; an emission layer on the first electrode; a first electron transport layer on the emission layer, the first electron transport layer including a first electron transport material; a second electron transport layer on the first electron transport layer, the second electron transport layer including the first electron transport material, a second electron transport material, and a third electron transport material; a third electron transport layer on the second electron transport layer, the third electron transport layer including the second electron transport material and the third electron transport material; and a second electrode on the third electron transport layer, and wherein the first electron transport material, the second electron transport material and the third electron transport material are different from one another.

The first electron transport material may be a compound that includes a carbazole group and a triazine group, the second electron transport material may be a compound that includes a benzoquinoline group and a phosphine oxide group, and the third electron transport material may be one of LiQ, LiF, Li$_2$O, CsF, BaF, BaO, Al$_2$O$_3$, NaCl, RbCl, RbI, Ca, Cs, and Yb.

The first electron transport material may be Compound 1 below,

[Compound 1]

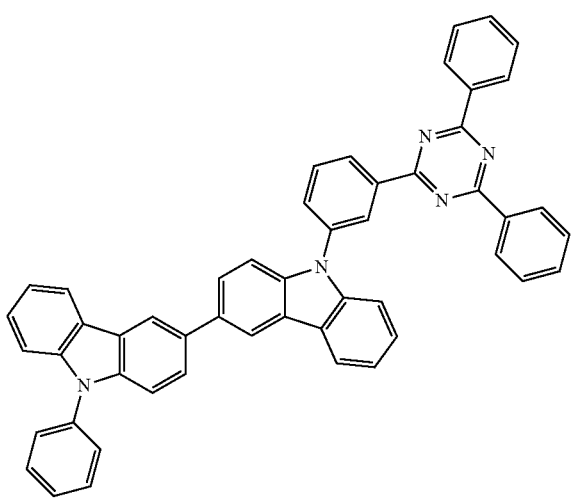

the second electron transport material may be Compound 2 below,

[Compound 2]

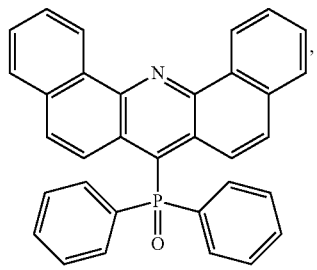

and the third electron transport material may be LiQ.

The first electron transport layer, the second electron transport layer, and the third electron transport layer may satisfy Formula 2 below:

$$x3 > x1 > x2 \qquad \text{Formula 2:}$$

wherein: x1 is a thickness of the first electron transport layer, x2 is a thickness of the second electron transport layer, and x3 is a thickness of the third electron transport layer.

A thickness of the second electron transport layer may be about 1% to about 6% of a total thickness of the electron transport layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
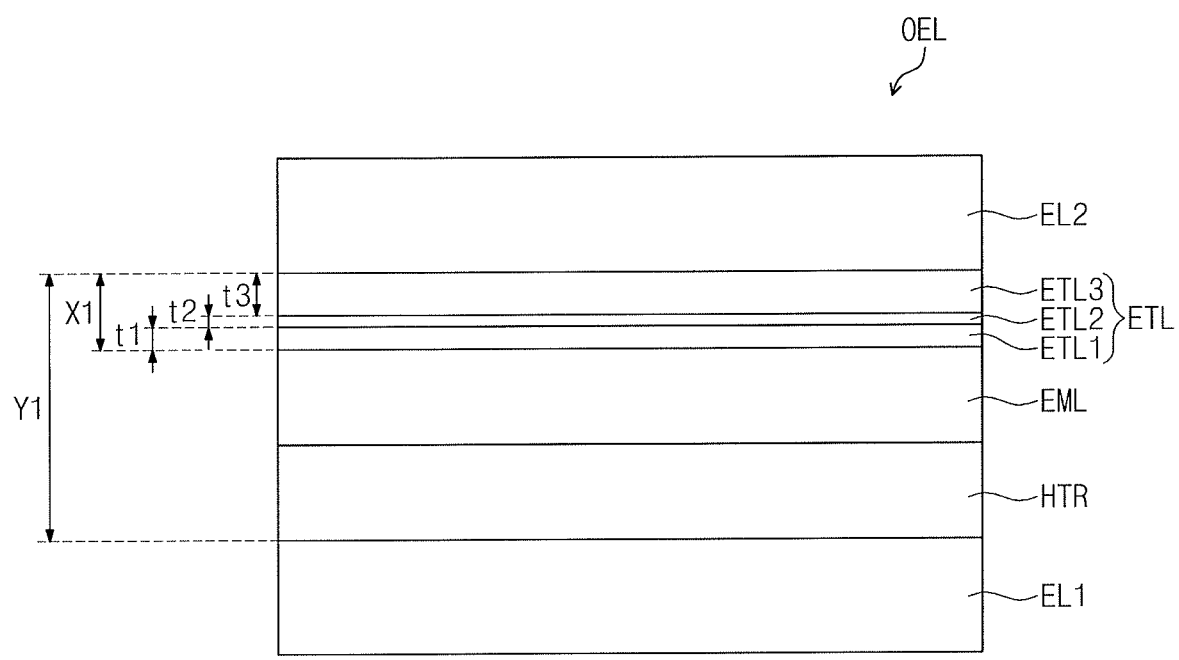
FIG. 1 illustrate a cross sectional view schematically showing an organic electroluminescent device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or element, it can be directly on the other layer or element, or intervening elements may also be present. In addition, it will also be understood that when a layer is referred to as being "between" two layers, it can be the only layer between the two layers, or one or more intervening layers may also be present. Like reference numerals refer to like elements throughout.

The term "first, second or forth" may be used to describe various elements, but these elements are not limited thereto. These terms are used only for distinguishing one element from other elements. For example, without departing from the scope of the present application, a first element may be designated as a second element, and likewise the second element may be designated as the first element. Unless otherwise specifically indicated in the context, the singular forms contemplate the plural forms.

It will be understood that, in the application, the term "comprise," "include," or "have" is to designate presence of a certain feature, number, step, operation, element, component, or combination thereof indicated in the specification, and not to exclude presence or addition of one or more other features, numbers, steps, operations, elements, components, or combination thereof.

Hereinafter, exemplary embodiments will be described in detail with reference to the accompanying drawings.

Figure 2:
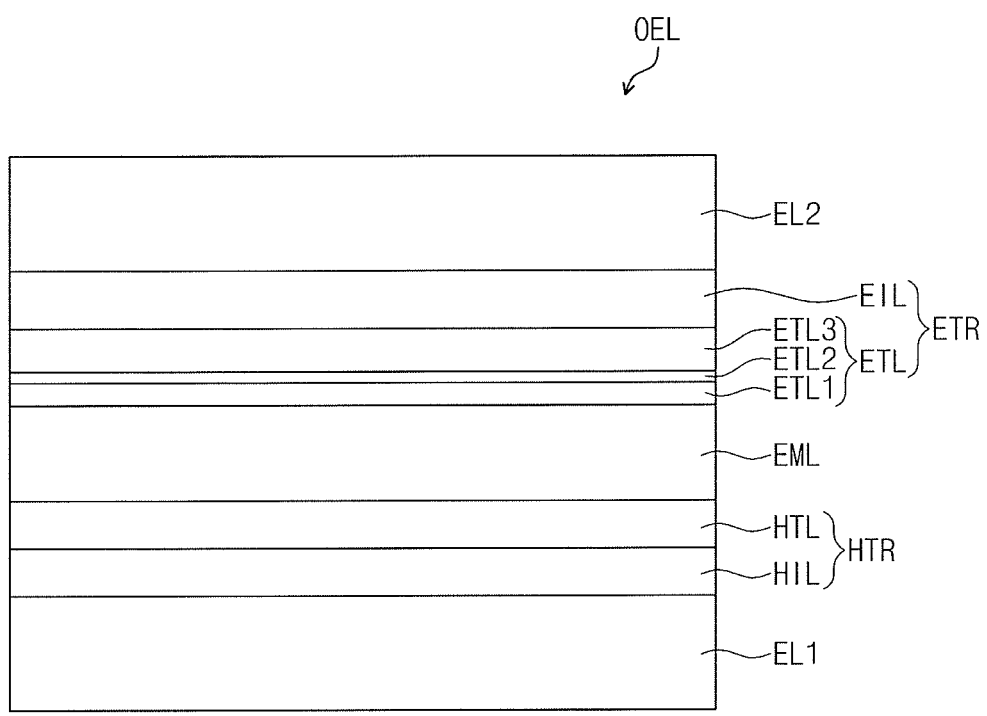
FIG. 2 illustrates a cross sectional view schematically showing an organic electroluminescent device according to an embodiment.
Figure 3:
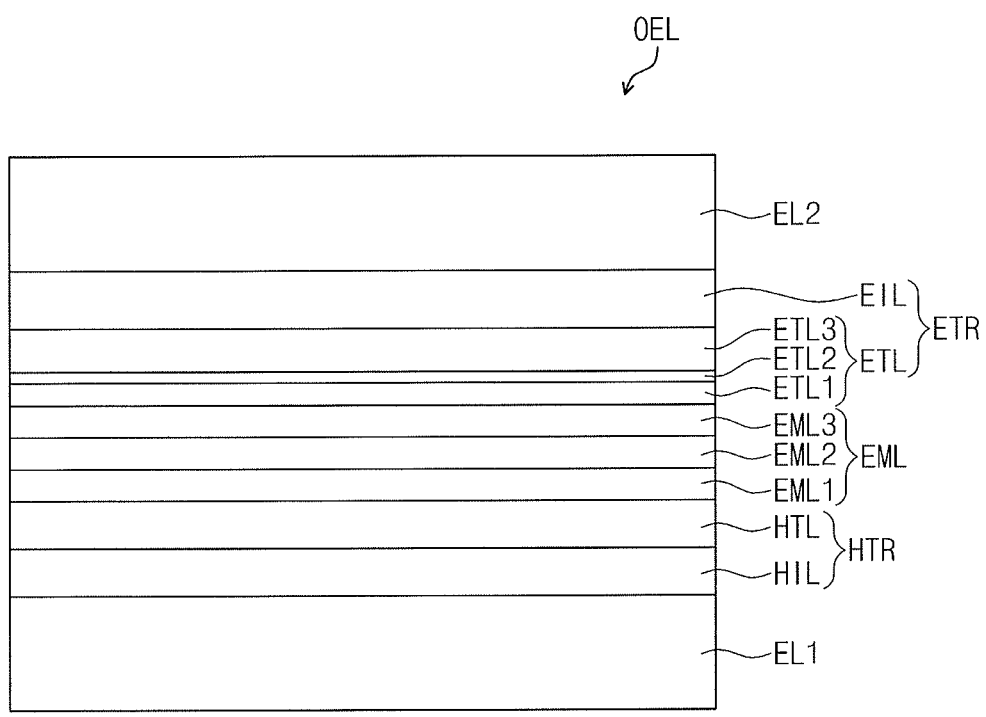
FIG. 3 illustrates a cross sectional view schematically showing an organic electroluminescent device according to an embodiment.
Figure 4:
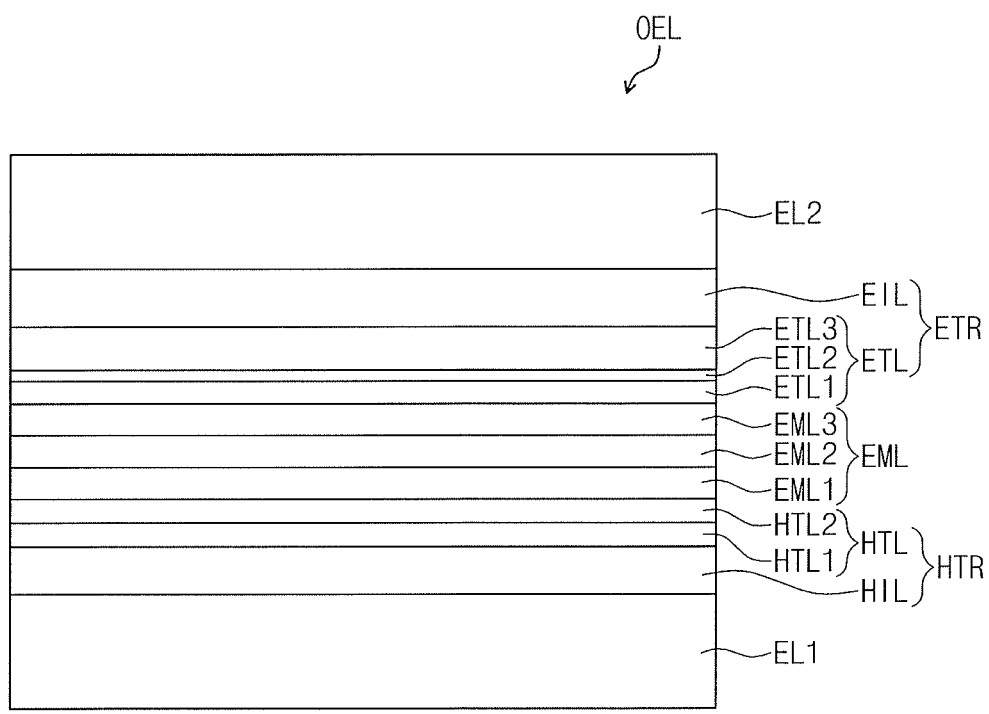
FIG. 4 illustrates a cross sectional view schematically showing an organic electroluminescent device according to an embodiment.

FIG. 1 illustrates a cross sectional view schematically showing an organic electroluminescent device according to an embodiment. FIG. 2 illustrates a cross sectional view schematically showing an organic electroluminescent device according to an embodiment. FIG. 3 illustrates cross sectional view schematically showing an organic electroluminescent device according to an embodiment. FIG. 4 illustrates a cross sectional view schematically showing an organic electroluminescent device according to an embodiment.

Referring to FIGS. 1, 2, 3, and 4, the organic electroluminescent device OEL according to an embodiment may include a first electrode EL1, a second electrode EL2 on the first electrode EL1, an emission layer EML between the first electrode EL1 and the second electrode EL2, and an electron transport layer ETL between the emission layer EML and the second electrode EL2.

The first electrode EL1 and the second electrode EL2 may be opposite to each other. The first electrode EL1 may have conductivity. The first electrode EL1 may be a pixel electrode or anode. The first electrode EL1 may be a transmissive electrode, a semi-transmissive electrode, or a reflective electrode. In the case where the first electrode EL1 is a transmissive electrode, the first electrode EL1 may be made of a transparent metal oxide, e.g., indium tin oxide (ITO), indium zinc oxide (IZO), zinc oxide (ZnO), or indium tin zinc oxide (ITZO). In the case where the first electrode EL1 is a semi-transmissive electrode or reflective electrode, the first electrode EL1 may include, e.g., Ag, Mg, Al, Pt, Pd, Au, Ni, Nd, Ir, Cr or a mixture or alloy of a metal.

On the first electrode EL1, an organic layer may be disposed. The organic layer may include the emission layer EML. The organic layer may further include a hole transport region HTR and an electron transport region ETR.

The hole transport region HTR may be between the first electrode EL1 and the emission layer EML. The hole transport region HTR may be on the first electrode EL1. The hole transport region HTR may include at least one of a hole injection layer, a hole transport layer HTL, a buffer layer, and an electron blocking layer.

The hole transport region HTR may have a monolayer structure made of a single material, a monolayer made of a plurality of different materials structure, or a multilayer structure having a plurality of layers made of a plurality of different materials.

For example, the hole transport region HTR may have a monolayer structure made of a plurality of different materials or a structure in which the hole injection layer HIL/hole transport layer HTL, hole injection layer HIL/hole transport layer HTL/buffer layer, hole injection layer HIL/buffer layer, hole transport layer HTL/buffer layer or hole injection layer HIL/hole transport layer HTL/electron blocking layer are sequentially laminated from the first electrode EL1.

The hole transport region HTR may be formed by using various methods, e.g., vacuum deposition, spin coating, cast, Langmuir-Blodgett (LB) method, inkjet printing, laser printing, and laser induced thermal imaging LITI.

When the hole transport region HTR includes the hole injection layer HIL, the hole transport region HTR may include, e.g., a phthalocyanine compound such as copper phthalocyanine; N,N-diphenyl-N,N'-bis-[4-(phenyl-m-tolylamino)-phenyl]-biphenyl-4,4'-diamine (DNTPD), 4,4',4"-tris(3-methylphenylphenylamino) triphenylamine (m-MTDATA), 4,4'4"-tris(N,N-diphenylamino)triphenylamine (TDATA), 4,4',4"-tris{N-(2-naphthyl)-N-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), or polyaniline/poly(4-styrene sulfonate) (PANI/PSS).

In the case where the hole transport region HTR includes the hole transport layer HTL, the hole transport region HTR may include, e.g., a carbazole-based derivative such as N-phenyl carbazole, and poly vinyl carbazole, a fluorene-based derivative, a triphenylamine-based derivative such as N,N'-bis(3-methylphenyl)-N,N'-diphenyl-[1,1-biphenyl]-4,4'-diamine (TPD), and 4,4',4"-tris(N-carbazolyl)triphenylamine (TCTA), N,N'-di(1-naphthyl)-N,N'-diphenylbenzidine (NPB), or 4,4'-cyclohexylidene bis[N,N-bis(4-methylphenyl)benzenamine] (TAPC).

The hole transport layer HTL may include a first hole transport layer HTL1 and a second hole transport layer HTL2. The first hole transport layer HTL1 may be on the first electrode EL1, and the second hole transport layer HTL2 may be on the first hole transport layer HTL1. The first hole transport layer HTL1 may include a p-type dopant. As a p-type dopant, a suitable p-type dopant may be used.

The thickness of the hole transport region HTR may be about 100 Å to about 10000 Å, e.g., about 100 Å to about 1500 Å. In the case where the hole transport region HTR includes both the hole injection layer HIL and the hole transport layer HTL, the thickness of the hole injection layer HIL may be about 100 Å to about 10000 Å, e.g., about 100 Å to about 1500 Å, and/or the thickness of the hole transport layer HTL may be about 50 Å to about 2000 Å, e.g., about 100 Å to about 1500 Å. When the thicknesses of the hole transport region HTR, hole injection layer HIL, and hole transport layer HTL satisfy the above range, it is possible to obtain a desirable hole transport property without a substantial increase in driving voltage.

The emission layer EML may be between the first electrode EL1 and the second electrode EL2. The emission layer EML may be on the hole transport layer HTL. The emission layer EML may be on the second hole transport layer HTL2. The emission layer EML may have a monolayer structure made of a single material, a monolayer structure made of a plurality of different materials, or multilayer structure having a plurality of layers made of a plurality of different materials.

In the case where the emission layer EML is a monolayer structure, the emission layer EML may emit, e.g., red-light, green-light, or blue-light.

The emission layer EML may include a multilayer structure having a plurality of layers as described above. The emission layer EML may include a first emission layer EML1 on the first electrode EL1, a second emission layer EML2 on the first emission layer EML1, a third emission layer EML3 on the second emission layer EML2. The first emission layer EML1 and the second emission layer EML2 may contact each other, and the second emission layer EML2 and the third emission layer EML3 may contact each other. In an implementation, light emitted from each of the first emission layer EML1, the second emission layer EML2, and the third emission layer EML3 may combine together to form white light. For example, the first emission layer EML1 may emit blue light; the second emission layer EML2 may emit green light; and the third emission layer EML3 may emit red light. In an implementation, two emission layers among the first emission layer EML1, the second emission layer EML2, and the third emission layer EML3 may respectively emit blue light, and the remaining one emission layer may emit yellow light.

The emission layer EML may be formed through various methods, e.g., vacuum deposition, spin coating, cast, Langmuir-Blodgett (LB), inkjet printing, laser printing, and laser induced thermal imaging (LITI).

The emission layer EML may be made of a suitable material, e.g., a material emitting red, green or blue color, and may include a fluorescent material, or a phosphorescent material. The emission layer EML may include a host and dopant.

A suitable host may include, e.g., tris(8-hydroxyquinolino)aluminum (Alq3), 4,4'-bis(N-carbazolyl)-1,1'-biphenyl (CBP), poly(n-vinylcabazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazole-2-yl)benzene (TPBi), 3-tert-butyl-9,10-di(napth-2-yl)anthracene (TBADN), distyrylarylene (DSA), 4,4'-bis(9-carbazolyl)-2,2''-dimethyl-biphenyl (CDBP), or 2-methyl-9,10-bis(naphthalen-2-yl)anthracene (MADN).

When the emission layer EML emits red color, the emission layer EML may include a fluorescent material including, e.g., PBD:Eu(DBM)3(Phen)(tris(dibenzoylmethanato)phenanthoroline europium) or perylene. When the emission layer EML emits red color, a dopant included in the emission layer EML may be selected from, e.g., an organometallic complex or a metal complex such as (acac)(bis(1-phenylisoquinoline)acetylacetonate iridium (PIQIr), (acac)(bis(1-phenylquinoline)acetylacetonate iridium (PQIr), tris(1-phenylquinoline)iridium (PQIr) and octaethylporphyrin platinum (PtOEP).

When the emission layer EML emits green color, the emission layer EML may include, e.g., a fluorescent material including tris(8-hydroxyquinolino)aluminum (Alq3). When the emission layer EML emits green color, a dopant included in the emission layer EML may be selected from an organometallic complex or a metal complex such as Ir(ppy)3 (fac-tris(2-phenylpyridine)iridium).

When the emission layer EML emits blue color, the emission layer EML may include a fluorescent material including, e.g., spiro-DPVBi, spiro-6P, distyryl-benzene (DSB), distyryl-arylene (DSA), polyfluorene (PFO)-based polymer, or poly(p-phenylene vinylene) (PPV)-based polymer. When the emission layer EML emits blue color, a dopant included in the emission layer EML may be selected from an organometallic complex or a metal complex such as (4,6-F2ppy)$_2$Irpic.

The electron transport region ETR may be on the emission layer EML. The electron transport region ETR may be formed by using various methods, e.g., vacuum deposition, spin coating, cast, Langmuir-Blodgett (LB) method, inkjet printing, laser printing, and laser induced thermal imaging LITI.

The electron transport region ETR may include an electron transport layer ETL. The electron transport layer ETL may be on the emission layer EML. In an implementation, the electron transport layer ETL may include, e.g., a first electron transport layer ETL1, a second electron transport layer ETL2, and a third electron transport layer ETL3.

The first electron transport layer ETL1 may be on the emission layer EML. The first electron transport layer ETL1 may include, e.g., a first electron transport material. The first electron transport material may be, e.g., a derivative of a compound including a carbazole group and a triazine group. For example, the first electron transport material may be a compound that includes a carbazole group or moiety and a triazine group or moiety. In an implementation, the first electron transport material may be, e.g., a derivative of a compound including two carbazole groups and one triazine group. In an implementation, the first electron transport material may be a derivative of a compound in which a nitrogen atom (N) of a carbazole group is substituted with or bound to a triazine group by using a phenylene group as a linker.

In an implementation, the first electron transport material may be compound 1 below.

[Compound 1]

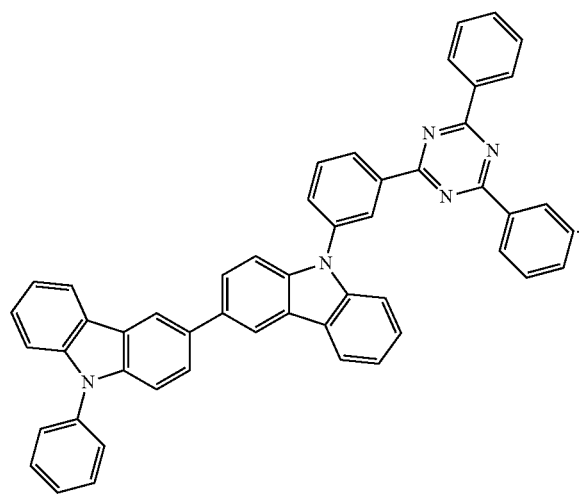

The second electron transport layer ETL2 may be on the first electron transport layer ETL1. The second electron transport layer ETL2 may be, e.g., a mixed electron transport layer in which three different materials are mixed. The second electron transport layer ETL2 may include, e.g., the first electron transport material, a second electron transport material, and a third electron transport material. For the first electron transport material, aforementioned description may be equally adopted, e.g., the first electron transport material may understood by referring to that described above.

A ratio of the first, second, and third electron transport materials included in the second electron transport layer ETL2 may be, e.g., 1:1:1. In the case where the above range is satisfied, the effect of increasing lifespan may be enhanced. The ratio may be weight ratio.

In an implementation, the first electron transport materials included in the first electron transport layer ETL1 and the second electron transport layer ETL2 may be different one from each other, provided that the materials are still as described above, e.g., a compound or derivatives of a compound including a carbazole group and triazine group. In an implementation, the first electron transport materials included in the first electron transport layer ETL1 and the second electron transport layer ETL2 may be the same. For example, the first electron transport materials included in the first electron transport layer ETL1 and the second electron transport layer ETL2 may both be Compound 1 above.

The second electron transport material included in the second electron transport layer ETL2 may be, e.g., a compound or a derivative of a compound including a benzoquinoline group and a phosphine oxide group. For example, the second electron transport material may be a compound that includes a benzoquinoline group or moiety and a phosphine oxide group or moiety. In an implementation, the second electron transport material may be a derivative of a compound including a benzoquinoline group and a phosphine oxide group bisubstituted with two phenyl groups. In an implementation, the second electron transport material may be a derivative of a compound including a dibenzoacridine group and a phosphine oxide group. In an implementation, the second electron transport material may be a derivative of a compound including a dibenzo[c,h]acridine group and a phosphine oxide group.

In an implementation, the second electron transport material may be Compound 2 below.

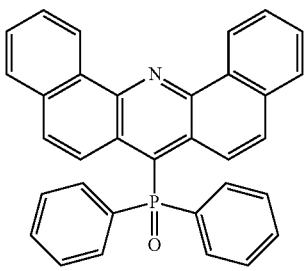

[Compound 2]

In an implementation, the third electron transport material included in the second electron transport layer ETL2 may include, e.g., at least one of an alkali metal or a complex thereof. In an implementation, the third electron transport material may include at least one of lithium (Li) or a complex thereof. In an implementation, the third electron transport material may include, e.g., lithium quinolate (LiQ), LiF, Li$_2$O, CsF, BaF, BaO, Al$_2$O$_3$, NaCl, RbCl, RbI, Ca, Cs, or Yb. For example, the third electron transport material may be LiQ.

The first electron transport material, the second electron transport material, and the third electron transport material may be different from one another. The first electron transport material may be different from each of the second electron transport material and the third electron transport material. The second electron transport material and the third electron transport material may be different from each other.

In an implementation, the first electron transport material and the second electron transport material may satisfy Formula 1 below:

[T1−T2]>0.4 eV      Formula 1:

In Formula 1, T1 is an energy level of the highest occupied molecular orbital (HOMO) of the first electron transport material, and T2 is an energy level of the highest occupied molecular orbital (HOMO) of the second electron transport material. The unit for energy level used in Formula 1 is eV.

The third electron transport layer ETL3 may be on the second electron transport layer ETL2. The third electron transport layer ETL3 may be a mixed electron transport layer in which two different materials are mixed. In an implementation, the third electron transport material ETL3 may include the second and third electron transport materials. The aforementioned description is equally applied to the second electron transport material, a repeated detailed description may be omitted. The aforementioned description may be equally applied to the third electron transport material, and a repeated detailed description may be omitted.

In an implementation, a ratio of the second electron transport material and the third electron transport material included in the third electron transport layer ETL3 may be, e.g., 6:4 to 4:6 or 4.5:5.5 to 4:6. When the above range is satisfied, effect on lifespan extension may be enhanced. The ratio may be weight ratio In an implementation, the second electron transport materials included in the second electron transport layer ETL2 and the third electron transport layer ETL3 may be different from each other, provided that the material is a derivative of a compound including a benzoquinoline group and a phosphine oxide group. In an implementation, the second electron transport materials included in the second electron transport layer ETL2 and the third electron transport layer ETL3 may be the same. For example, the second electron transport materials included in the second electron transport layer ETL2 and the third electron transport layer ETL3 may both be Compound 2 above.

In an implementation, the third electron transport materials included in the second electron transport layer ETL2 and the third electron transport layer ETL3 may be different one from each other. In an implementation, the material may include at least one of an alkali metal or a complex thereof. For example, the third electron transport material included in the second electron transport layer ETL2 and the third electron transport layer ETL3 may be one of LiQ, LiF, Li$_2$O, CsF, BaF, BaO, Al$_2$O$_3$, NaCl, RbCl, RbI, Ca, Cs, or Yb. In an implementation, the third electron transport materials included in the second electron transport layer ETL2 and the third electron transport layer ETL3 may both be lithium quinolate (LiQ).

The first electron transport layer ETL1, the second electron transport layer ETL2, and the third electron transport layer ETL3 may satisfy Formula 2 below.

x3>x1>x2      Formula 2:

In Formula 2, x1 is the thickness of the first electron transport layer ETL1; x2 is the thickness of the second electron transport layer ETL2; and x3 is the thickness of the third electron transport layer ETL3.

The thickness of the first electron transport layer ETL1 may refer to a vertical distance from one face to another face of the first electron transport layer ETL1. In an implementation, the thickness of the first electron transport layer ETL1 may refer to an average vertical distance between one face to the other face of the first electron transport layer ETL1. Either one face or the other face of the first electron transport layer ETL1 is opposite to the first electrode EL1. The first electron transport layer ETL1 may further include two side faces linking the one face and the other face. The first electron transport layer ETL1 may further include first and second side faces, wherein the first side face links one face to one end of the other face, and the second side face links one face to the other end of the other face.

The thickness of the second electron transport layer ETL2 may refer to a vertical distance from one face to the other face of the second electron transport layer ETL2. In an implementation, the thickness of the second electron transport layer ETL2 may refer to an average vertical distance from one face to the other face of the second electron transport layer ETL2. Either one face or the other face of the second electron transport layer ETL2 is opposite to the first electrode EL1. The second electron transport layer ETL2 may further include two side faces linking the one face and the other face. The second electron transport layer ETL2 further includes first and second side faces, wherein the first side face links one face to one end of the other face, and the second side face links one face to the other end of the other face.

The thickness of the third electron transport layer ETL3 may refer to a vertical distance from one face to the other face of the third electron transport layer ETL3. In an implementation, the thickness of the third electron transport layer ETL3 may refer to an average vertical distance from one face to the other face of the third electron transport layer ETL3. Either one face or the other face of the third electron transport layer ETL3 is opposite to the first electrode EL1. The third electron transport layer ETL3 further includes two side faces linking the one face and the other face. The third electron transport layer ETL3 further includes first and second side faces, wherein the first side face links one face and one end of the other face, and the second side face links one face to the other end of the other face.

When the first electron transport layer ETL1, the second electron transport layer ETL2, and the third electron transport layer ETL3 satisfy Formula 2 above, low voltage and high efficiency effects of the organic electroluminescent device may be increased.

The electron transport layer ETL may satisfy Formula 3 below.

$$10 < [X1/Y1] \times 100 < 15 \quad \text{Formula 3:}$$

In Formula 3, X1 is a total thickness of the electron transport layer ETL, Y1 is a distance (e.g., a height of a space) between the first electrode EL1 and the second electrode EL2.

When the electron transport layer ETL includes only the first electron transport layer ETL1, the second electron transport layer ETL2, and the third electron transport layer ETL3, the total thickness (X1) of the electron transport layer ETL may be a sum of the thickness (x1) of the first electron transport layer ETL1, the thickness (x2) of the second electron transport layer ETL2, and the thickness (x3) of the third electron transport layer ETL3.

In an implementation, the first electron transport layer ETL1, the second electron transport layer ETL2, and the third electron transport layer ETL3 may be sequentially provided on the emission layer EML without interposition of other organic layers. One face of the first electron transport layer ETL1 may contact one face of the emission layer EML; another face of the first electron transport layer ETL1 may contact one face of the second electron transport layer ETL2; and another face of the second electron transport layer ETL2 may contact one face of the third electron transport layer ETL3. When the emission layer EML includes the first emission layer EML1, the second emission layer EML2, and the third emission layer EML3, one face of the first electron transport layer ETL1 may contact one face of the third emission layer EML3.

A distance (Y1) between the first electrode EL1 and the second electrode EL2 may refer to the total thickness of organic layers between the first electrode EL1 and the second electrode EL2. The distance (Y1) between the first electrode EL1 and the second electrode EL2 may refer or correspond to sum of thicknesses of layers between the first electrode EL1 and the second electrode EL2.

In an implementation, the total thickness (X1) of the electron transport layer ETL may be, e.g., about 300 Å to about 400 Å, about 300 Å to about 390 Å or about 310 Å to about 360 Å.

Y1, which is a distance between the first electrode EL1 and the second electrode EL2, may be, e.g., about 2500 Å to about 5000 Å, about 2500 Å to about 4000 Å or about 2500 Å to about 3000 Å.

When the electron transport layer ETL satisfies Formula 3 above, low voltage and high efficiency effects of the organic electroluminescent device may be enhanced.

In an implementation, the thickness (x1) of the first electron transport layer ETL1 may be about 10% to about 20% of the total thickness (X1) of the electron transport layer ETL. In an implementation, the thickness (x1) of the first electron transport layer ETL1 may be about 10% to about 15% of the total thickness (X1) of the electron transport layer ETL. In an implementation, the thickness (x1) of the first electron transport layer ETL1 may be about 11% to about 14% of the total thickness (X1) of the electron transport layer ETL. In this case, low voltage and high efficiency effects of the organic electroluminescent device may be enhanced.

In an implementation, the thickness (x1) of the first electron transport layer ETL1 may be, e.g., about 40 Å to about 60 Å or about 45 Å to about 55 Å. In an implementation, the thickness (x1) of the first electron transport layer ETL1 may be, e.g., about 50 Å.

In an implementation, the thickness (x2) of the second electron transport layer ETL2 may be about 1% to about 6% of the total thickness (X1) of the electron transport layer ETL. In an implementation, the thickness (x2) of the second electron transport layer ETL2 may be about 1% to about 4% of the total thickness (X1) of the electron transport layer ETL. In this case, low voltage and high efficiency effects of the organic electroluminescent device may be more enhanced.

In an implementation, the thickness (x2) of the second electron transport layer ETL2 may be, e.g., about 3 Å to about 20 Å, about 3 Å to about 17 Å, or about 10 Å to about 14 Å.

In an implementation, the thickness (x3) of the third electron transport layer ETL3 may be, e.g., 250 Å to about 350 Å, about 270 Å to about 330 Å, or about 290 Å to about 310 Å.

In an implementation, the electron transport region ETR may further include an electron injection layer EIL. In the case where the electron transport region ETR includes the electron injection layer EIL, the electron transport region ETR may include a metal or metal complex, e.g., LiF, lithium quinolate (LiQ), $Li_2O$, BaO, NaCl, CsF, and Yb, or a halogenated metal such as RbCl, and RbI. In an implementation, the electron injection layer EIL may also be made of a material in which an electron transport material and an insulating organometallic salt are mixed. The organometallic salt may be a material having an energy band gap of at least about 4 eV. In an implementation, the organometallic salt may include, e.g., metal acetate, metal benzoate, metal acetoacetate, metal acetylacetonate, or metal stearate. In an implementation, the thickness of the electron injection layer EIL may be about 1 Å to about 100 Å, or about 3 Å to about 90 Å. In the case where the thickness of the electron injection layer EIL satisfies the range described above, it is possible to obtain a desirable electron injection property without a substantial increase in driving voltage.

In an implementation, the electron transport region ETR may further include a hole blocking layer. The hole blocking layer may include, e.g., at least one of 2,9-dimethyl-4,7-diphenyl-1,10-phenanthroline (BCP), Bphen(4,7-diphenyl-1,10-phenanthroline) or Bphen(4,7-diphenyl-1,10-phenanthroline). The thickness of the hole blocking layer may be about 20 Å to about 1000 Å, e.g., about 30 Å to about 300 Å. When the thickness of the hole blocking layer satisfies the range described above, it is possible to obtain an excellent hole blocking property without a substantial increase in driving voltage.

The second electrode EL2 may be on the electron transport region ETR. The second electrode EL2 may be a common electrode or cathode. The second electrode EL2 may be a transmissive electrode, a semi-transmissive electrode, or a reflective electrode.

In the case where the second electrode EL2 is a transmissive electrode, the second electrode EL2 may include, e.g., Li, Ca, LiF/Ca, LiF/Al, Al, Mg, BaF, Ba, Ag or a compound, alloy, or mixture thereof (e.g., mixture of Ag and Mg).

The second electrode EL2 may include an auxiliary electrode. The auxiliary electrode may include a film formed to face the emitting layer EML by depositing any of the foregoing materials, and a transparent metal oxide film on the film, the transparent metal oxide film being made of, e.g., indium tin oxide (ITO), indium zinc oxide (IZO), zinc oxide (ZnO), or indium tin zinc oxide (ITZO). In an implementation, the auxiliary electrode may include Mo, and Ti.

In the case where the second electrode EL2 is a semi-transmissive or reflective electrode, the second electrode EL2 may include, e.g., Ag, Mg, Al, Pt, Pd, Au, Ni, Nd, Ir, Cr, Li, Ca, LiF/Ca, LiF/Al, Mo, Ti or a compound or mixture thereof (e.g., mixture of Ag and Mg). In an implementation, the electrode may have a multilayer structure including a reflective film or semi-transmissive film made of any foregoing material and a transparent conductive film made of ITO, IZO, ZnO, or ITZO.

In the case where the organic electroluminescent device OEL is a top emission type, the first electrode EL1 may be a reflective electrode, and the second electrode EL2 may be a transmissive electrode or a semi-transmissive electrode. In the case where the organic electroluminescent device is a bottom emission type, the first electrode EL1 may be a transmissive electrode or a semi-transmissive electrode, and the second electrode EL2 may be a reflective electrode.

In the organic electroluminescent device OEL according to an embodiment, voltage may be respectively applied to the first electrode EL1 and the second electrode EL2, so that holes injected from the first electrode EL1 are transported, via the hole transport region HTR, to the emission layer EML, and electrons injected from the second electrode EL2 are transported, via the electron transport region ETR, to the emission layer EML. The electrons and holes recombine in the emission layer EML to form excitons which drop from the excited state to the ground state, while emitting light.

In an implementation, an organic capping layer may be provided on the second electrode EL2. The organic capping layer may reflect light emitted from the emission layer EML toward the emission layer EML on the top of the organic capping layer. The reflected light may be amplified within the organic layer through a resonance effect, thereby increasing light efficiency. In the top emission type organic electroluminescent device, the organic capping layer may help prevent the second electrode EL2 from loss of light through total reflection of light.

In an implementation, the organic capping layer may include, e.g., at least one of N4,N4,N4',N4'-tetra(biphenyl-4-yl) biphenyl-4,4'-diamine (TPD15), 4,4',4"-tris (carbazolsol-9-yl) triphenylamine (TCTA), N,N'-bis(naphthalen-1-yl), N,N'-bis (phenyl)-2,2'-dimethylbenzidine (α-NPD).

The organic capping layer may have the refractive index of about 1.6 to about 2.4. Maintaining the refractive index of the organic capping layer at about 1.6 or greater may help ensure that light emitted from the emission layer EML is sufficiently reflected toward the emission layer ELM on the top of the organic capping layer, and that the amount of light to be amplified within the organic layer through a resonance effect is not reduced. Accordingly, light efficiency of the organic electroluminescent device OEL may be maintained. Maintaining the refractive index of the organic capping layer at about 2.4 or less may help ensure that light emitted from the emission layer EML is not excessively reflected toward the emission layer EML on the top face of the organic capping layer and thus does not penetrate the organic capping layer. Accordingly, the amount of light capable of displaying images may be maintained.

In terms of high efficiency, as an electron transport layer included in an organic electroluminescent device, a mixed electron transport layer may be used, wherein the mixed electron transport layer may include one electron transport material and an alkali metal or a complex thereof. An organic electroluminescent device including the mixed electron transport layer may have limitation of variations in lifespan and efficiency depending on properties of electron transport materials and limitation of decline in lifespan of the organic electroluminescent device due to degradation of the electron transport materials.

An organic electroluminescent device according to an embodiment may solve the limitations by introducing an electron transport layer having 3-layer structure in which a mixed electron transport layer having 3 types of materials mixed therein is provided in the middle. Specifically, the organic electroluminescent device according to an embodiment may achieve long lifespan and high efficiency by introducing the electron transport layer having the 3-layer structure and by designating materials and combination of materials for each layer.

Hereinafter, an organic electroluminescent display according to an embodiment will be described. Hereinafter, description about different features from the aforementioned organic electroluminescent device OEL according to an embodiment will be specifically provided, and features that are not described adopt those of the aforementioned organic electroluminescent device OEL according to an embodiment.

Figure 6:
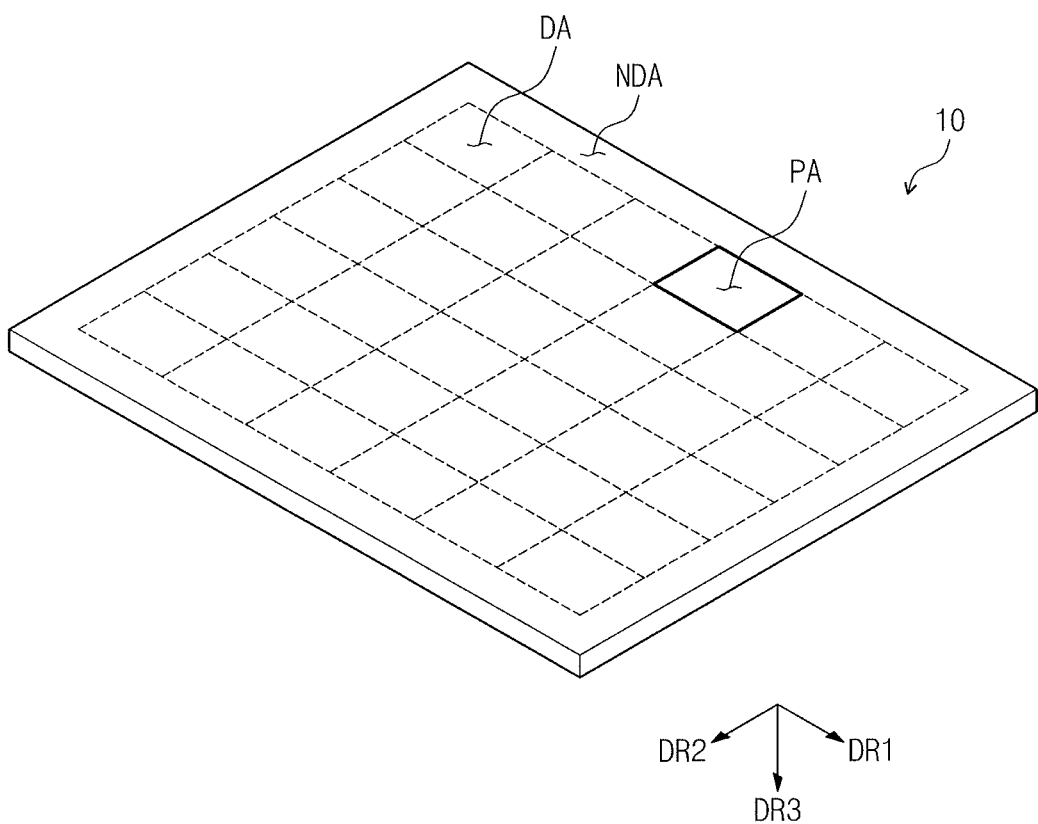
FIG. 6 illustrates a perspective view schematically showing an organic electroluminescent device according to an embodiment.

FIG. 6 illustrates a perspective view schematically showing an organic electroluminescent display according to an embodiment.

Referring to FIG. 6, the organic electroluminescent display 10 according to an embodiment includes a display area DA and a non-display area NDA.

The display area DA is configured to display an image. When viewing from the thickness direction of the organic electroluminescent display 10 (e.g., DR3), the display area DA may approximatively have a rectangular shape.

The display area DA includes a plurality of pixel areas PAs. The pixel areas PAs may be disposed in a matrix form. The pixel areas PAs may be defined by a pixel define layer (PDL in FIG. 8). The pixel areas PAs may include each of the plurality of pixels (PX in FIG. 6).

The non-display area NDA is not configured to display an image. When viewing the organic electroluminescent display 10 from the thickness direction (DR3), the non-display area NDA, e.g., may surround the display area DA. The non-display area NDA may adjacent to the display area DA in a first direction (e.g., DR1) and a second direction (e.g., DR2) which crosses the first direction (e.g., DR1).

Figure 7:
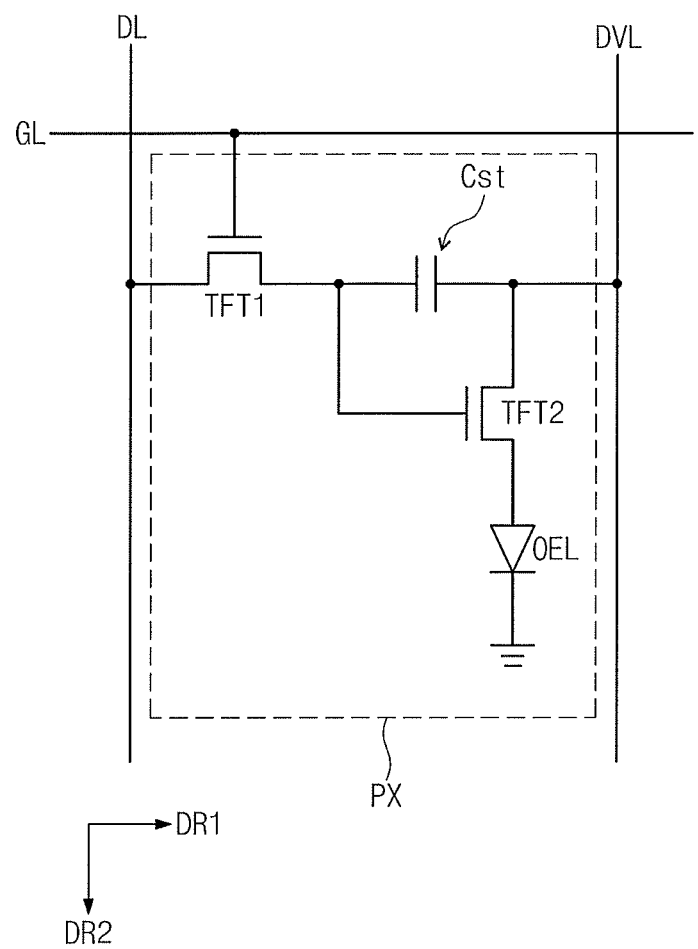
FIG. 7 illustrates a circuit diagram of one of pixels included in an organic electroluminescent device according to an embodiment.

FIG. 7 illustrates a circuit diagram of one of pixels included in the organic electroluminescent display according to an embodiment.

Figure 8:
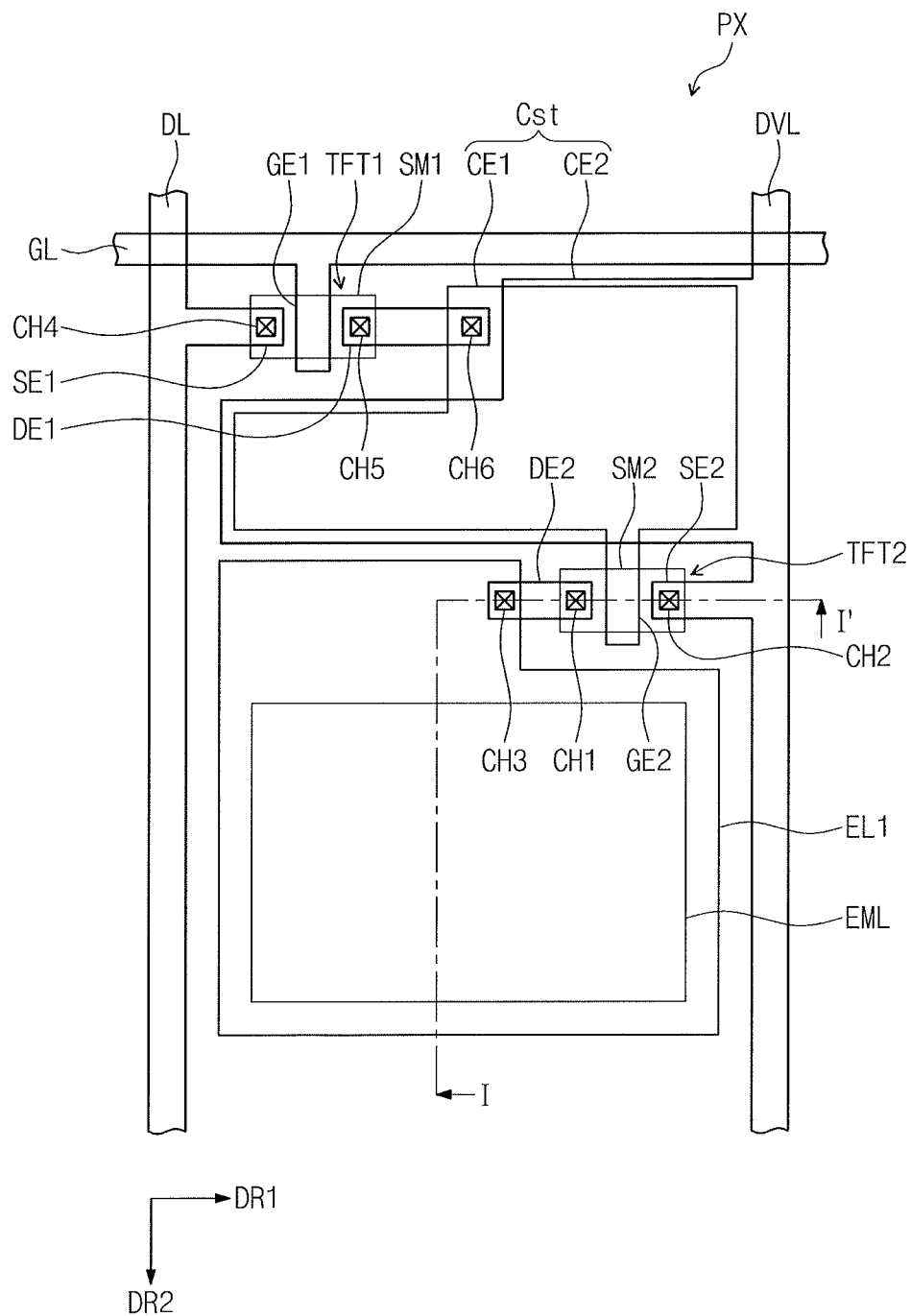
FIG. 8 illustrates plan view showing one of pixels included in an organic electroluminescent device according to an embodiment.

FIG. 8 illustrates a plan view of one of pixels included in the organic electroluminescent display according to an embodiment.

Figure 9:
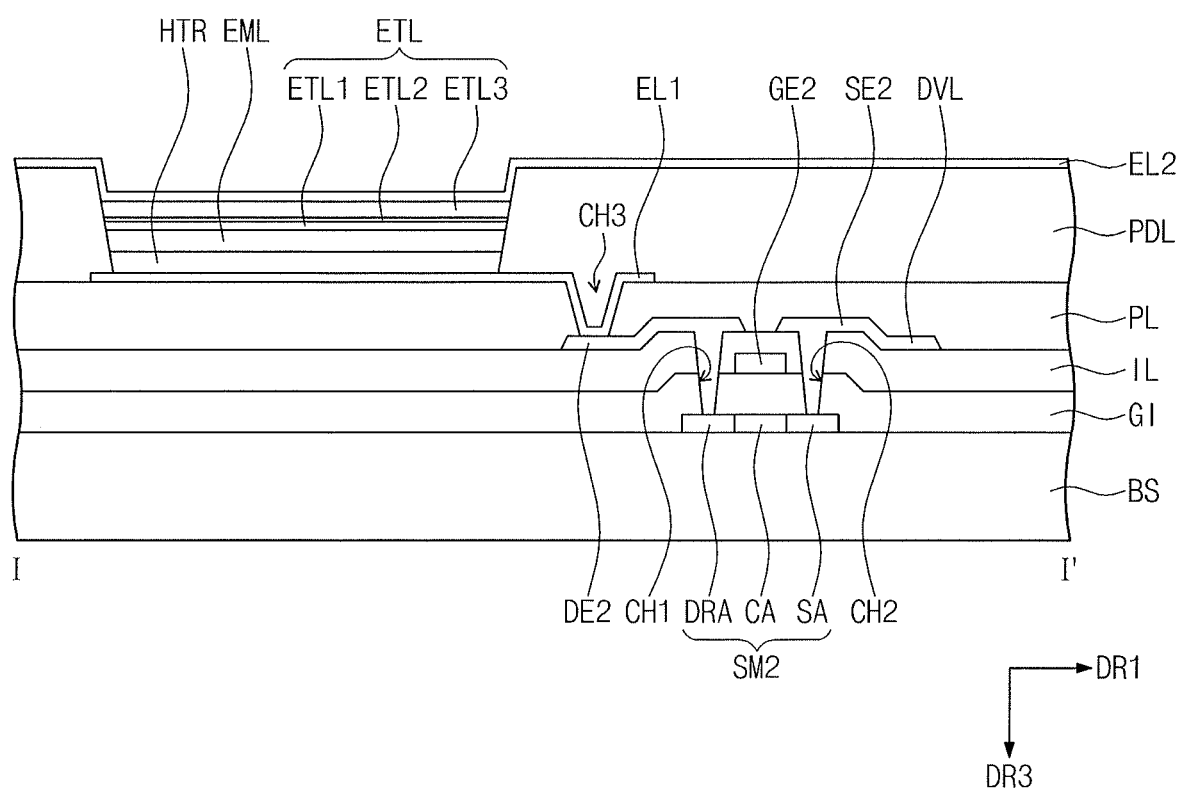
FIG. 9 illustrates a schematic cross sectional view taken along line I-I' of FIG. 8.

FIG. 9 illustrates a schematic cross sectional view taken along line I-I' of FIG. 8.

Referring to FIGS. 7 to 9, each pixel may include a line connecting part having a gate line GL, data line DL, and driving voltage line DVL, thin-film transistors TFT1, TFT2 coupled to the line connecting part, an organic electroluminescent device OEL coupled to the thin-film transistors TFT1, TFT2, and a capacitor Cst.

Each pixel PX may emit light of certain color, e.g., one of red light, green light, and blue light. Types of color light are not limited to those mentioned, and for example, cyan light, magenta light, and yellow light may be added. Each pixel PX may emit white light.

The gate line GL extends to the first direction DR1. The data line DL extends to the second direction DR2 crossing the gate line GL. The driving voltage line DVL extends to substantially same direction as the data line DL, i.e., the second direction DR2. The gate line GL is configured to transfer a scanning signal to the thin-film transistors TFT1, TFT2; the data line DL is configured to transfer a data signal to thin-film transistors TFT1, TFT2; and the driving voltage line DVL is configured to provide the thin-film transistors with the driving voltage.

The thin-film transistors TFT1, TFT2 may include a driving thin-film transistor TFT2 configured to control the organic electroluminescent device OEL and a switching thin-film transistor TFT1 configured to switching the driving thin-film transistor TFT2. In an embodiment, each pixel PX including two thin-film transistors TFT1, TFT2 is described. Rather, each pixel PX may include one thin-film transistor and a capacitor, or each pixel PX may include three or more thin-film transistors and two or more capacitors.

The switching thin-film transistor TFT1 includes a first gate electrode GE1, a first source electrode SE1 and a first drain electrode DE1. The first gate electrode GE1 is coupled to the gate line GL, and the first source electrode SE1 is coupled to the data line DL. The first drain electrode DE1 is coupled to a first common electrode CE1 via a fifth contact hole CH5. The switching thin-film transistor TFT1 is configured to transfer a data signal applied to the data line DL to the driving thin-film transistor TFT2 according to a scanning signal applied to the gate line GL.

The driving thin-film transistor TFT2 includes a second gate electrode GE2, a second source electrode SE2, and a second drain electrode DE2. The second gate electrode is coupled to the first common electrode CE1. The second source electrode SE2 is coupled to a driving voltage line DVL. The second drain electrode DE2 is coupled to the first electrode EL1 via a third contact hole CH3.

The first electrode EL1 is coupled to the second drain electrode DE2 of the driving thin-film transistor TFT2. A common voltage is applied to the second electrode EL2, and the emission layer EML displays an image by emitting light having certain color according to an output signal of the driving thin-film transistor TFT2.

The capacitor Cst is coupled between the second source electrode SE2 and the second gate electrode GE2 of the driving thin-film transistor TFT2 to fill and maintain a data signal entered to the gate electrode GE2 of the driving thin-film transistor TFT2. The capacitor Cst may include the first common electrode CE1 and the second common electrode CE2, wherein the first common electrode CE1 is coupled to the drain electrode DE1 via a sixth contact hole CH6, and the second common electrode CE2 is coupled to the driving voltage line DVL.

Referring to FIGS. 8 and 9, the organic electroluminescent display 10 according to an embodiment includes a base substrate BS where the thin-film transistor and organic electroluminescent device OEL are laminated. In an implementation, the base substrate BS may be, e.g., formed by using an insulating material such as glass, plastic and crystal. Organic polymers used in the base substrate BS may include polyethylene terephthalate (PET), polyethylene naphthalate (PEN), polyimide, or polyether sulfone. The base substrate BS may be selected in consideration of mechanical strength, thermal stability, transparency, surface smoothness, handling tractability, and water repellency, etc.

On the base substrate BS, a substrate buffer layer may be provided. The substrate buffer layer is configured to prevent impurities from dispersion to the switching thin-film transistor TFT1 and driving thin-film transistor TFT2. The substrate buffer layer may be formed by using silicon nitride (SiNx), silicon oxide (SiOx), or nitrified silicon oxide (SiOxNy), but may not be provided depending on materials of the base substrate BS and processing condition.

A first semiconductive layer SM1 and a second semiconductive layer SM2 are provided on the base substrate BS. The first semiconductive layer SM1 and the second semiconductive layer SM2 are formed by using a semiconductive material, and are respectively operated as an active layer of the switching thin-film transistor TFT1 and the driving thin-film transistor TFT2. The first semiconductive layer SM1 and the second semiconductive layer SM2 respectively include a source area SA, a drain area DRA, and a channel area CA provided between the source area SA and the drain area DRA. The first semiconductive layer SM1 and the second semiconductive layer SM2 may be formed by respectively selecting an inorganic semiconductor or organic semiconductor. Doping with an n-type impurity or p-type impurity may be performed on the source area SA and the drain area DRA.

A gate insulating layer GI is provided on the first semiconductive layer SM1 and the second semiconductive layer SM2. The gate insulating layer GI covers the first semiconductive layer SM1 and the second semiconductive layer SM2. The gate insulating layer GI may be formed by using an organic insulating material or an inorganic insulating material.

The first gate electrode GE1 and the second gate electrode GE2 are provided on the gate insulating layer GI. The first gate electrode GE1 and the second gate electrode GE2 are configured to respectively cover areas corresponding to channel areas CAs of the first semiconductive layer SM1 and the second semiconductive layer SM2.

An interlayer insulating layer IL is provided on the first gate electrode GE1 and the second gate electrode GE2. The interlayer insulating layer IL covers the first gate electrode GE1 and the second gate electrode GE2. The interlayer insulating layer IL may be formed by using an organic insulating material or an inorganic insulating material.

On the interlayer insulating layer IL, a first source electrode SE1, a first drain electrode DE1, a second source electrode SE2, and a second drain electrode DE2 are provided. The second drain electrode DE2 comes into contact with the drain area DRA of the second semiconductive layer SM2 via a first contact hole CH1 provided in the gate insulating layer GI and the interlayer insulating layer IL. The second source electrode SE2 comes into contact with the source area SA of the second semiconductive layer SM2 via a second contact hole CH2 provided in the gate insulating layer GI and the interlayer insulating layer IL. The first source electrode SE1 comes into contact with a source area of the first semiconductive layer SM1 via a fourth contact hole CH4 provided in the gate insulating layer GI and the interlayer insulating layer IL. The first drain electrode DE1 comes into contact with a drain area of the first semiconductive layer SM1 via a fifth contact hole CH5 provided in the gate insulating layer GI and the interlayer insulating layer IL.

A passivation layer PL is provided on the first source electrode SE1, the first drain electrode DE1, the second source electrode SE2, and the second drain electrode DE2. The passivation layer PL may serve as a role of a protecting film to protect the switching thin-film transistor TFT1 and driving thin-film transistor TFT2, or as a role of smoothening film to smoothen the top face thereof.

The first electrode EL1 is provided on the passivation layer PL. A pixel define layer PDL is provided on the passivation layer PL, wherein the pixel define layer PDL is configured to define pixel areas (PAs in FIG. 5) such that the pixel area respectively corresponds to each pixel PX. The pixel define layer PDL is protruded from the base substrate BS along a perimeter of each pixel PX, while exposing the top face of the first electrode EL1.

An organic electroluminescent device OEL is provided on each pixel area (PA in FIG. 5) surrounded by the pixel define layer PDL. The organic electroluminescent device OEL may include a first electrode EL1, a hole transport region HTR, an emission layer EML, an electron transport layer ETL, and a second electrode EL.

The organic electroluminescent display 10 according to an embodiment may include a plurality of pixels, wherein each pixel includes an organic electroluminescent device. Each pixel PX may include a first electrode EL1, a hole transport region HTR on the first electrode EL1, an emission layer EML on the hole transport region HTR, an electron transport layer ETL on the emission layer EML, and a second electrode EL2 on the electron transport layer ETL.

The organic electroluminescent device included in the organic electroluminescent display 10 according to an embodiment may further include, e.g., at least one of an hole blocking layer and an electron injection layer between the emission layer EML and the second electrode EL2 as necessary. The detailed description about the electron injection layer and the hole blocking layer will not be provided, since the aforementioned disclosure of the organic electroluminescent device according to an embodiment may be equally adopted.

The organic electroluminescent device included in the organic electroluminescent display 10 according to an embodiment may further include an organic capping layer provided on the second electrode EL2. The detailed description about the organic capping layer is same as aforementioned description about the organic electroluminescent device according to an embodiment.

The electron transport layer ETL may include, e.g., a first electron transport layer ETL1 provided on the emission layer EML, a second electron transport layer ETL2 provided on the first electron transport layer ETL1, and a third electron transport layer ETL3 provided on the second electron transport layer ETL2.

The first electron transport layer ETL1 may include, e.g., a first electron transport material. The second electron transport layer ETL2 may include, e.g., the first electron transport material, a second electron transport material, and a third electron transport material. The third electron transport layer ETL3 may include, e.g., the second electron transport material and the third electron transport material. The first, second, and third electron transport materials are different from one another.

The first electron transport material may be, e.g., a derivative of a compound including a carbazole group and a triazine group; the second electron transport material may be, e.g., a derivative of a compound including a benzoquinoline group and a phosphine oxide group; and the third electron transport material may be, e.g., LiQ, LiF, Li$_2$O, CsF, BaF, BaO, Al$_2$O$_3$, NaCl, RbCl, RbI, Ca, Cs, or Yb.

In an implementation, the first electron transport material may be Compound 1 below; the second electron transport material may be Compound 2 below; and the third electron transport material may be LiQ.

[Compound 1]

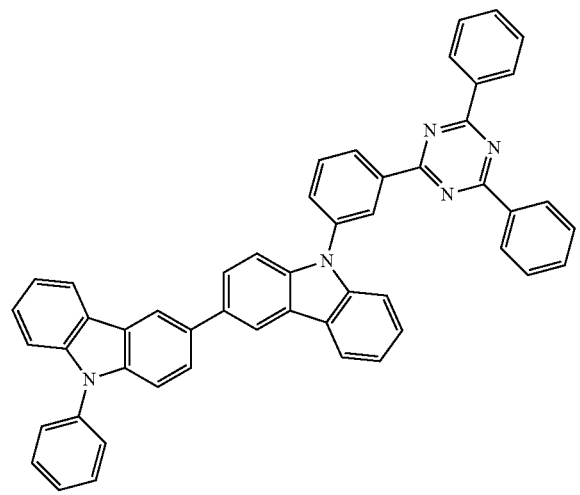

-continued

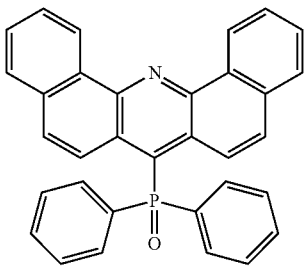

[Compound 2]

The first electron transport layer ETL1, the second electron transport layer ETL2, and the third electron transport layer ETL3 may satisfy Formula 2 above.

In an implementation, the thickness (x2) of the second electron transport layer ETL2 may be about 1% to about 6% of the total thickness (X1) of the electron transport layer ETL. In an implementation, the thickness (x2) of the second electron transport layer ETL2 may be about 1% to about 4% of the total thickness (X1) of the electron transport layer ETL.

Detailed description about each of first electrode EL1, hole transport region HTR, emission layer EML, electron transport layer ETL and second electrode EL2 is not provided, since aforementioned description about the organic electroluminescent device OEL according to an embodiment may be equally adopted.

By the organic electroluminescent display according to an embodiment, long lifespan may be achieved.

Hereinafter, the present invention will be described in more detail with reference to specific embodiments and comparative embodiments. However, embodiments below are illustrations for thorough understanding of the inventive concept, and the scope of the inventive concept is not limited thereto.

Embodiment

A glass substrate made of ITO/Ag/ITO was prepared, wherein the substrate was previously patterned such that the substrate has an emission area of 2×2 (mm). An organic electroluminescent device was manufactured by sequentially vacuum depositing, on the glass substrate, a first hole transport layer, which had a thickness of about 1350 Å and was doped with a p-type dopant, a second hole transport layer having a thickness of about 50 Å, a blue light emitting layer having a thickness of about 200 Å and dopant content of about 3%, a green light emitting layer having a thickness of about 400 Å and dopant content of about 5%, a red light emitting layer having a thickness of about 400 Å and dopant content of about 3%, a first electron transport layer having a thickness of about 50 Å, a second electron transport layer having a thickness of about 10 Å, a third electron transport layer having a thickness of about 300 Å, Ag:Mg having a thickness of about 110 Å; and an organic capping layer having a thickness of about 750 Å

In this case, the first electron transport layer included a first electron transport material, which is the Compound 1 above; the second electron transport layer included the Compounds 1 and 2 above, and lithium quinolate (LiQ); and the third electron transport layer included the Compound 2 above and LiQ.

Manufacture of the organic electroluminescent device was performed in a high vacuum chamber having the vacuum level of $1 \times 10^{-7}$ torr.

Comparative Embodiment

An organic electroluminescent device was manufactured same as the Embodiment except that a first electron transport layer, which included Compound 1 above and having a thickness of about 40 Å to about 60 Å, and a second electron transport layer, which included Compound 2 above and lithium quinolate (LiQ) and having the thickness of about 200 Å to about 320 Å, were laminated as an electron transport layer. The organic electroluminescent device according to the Comparative Embodiment included an electron transport layer having a 2-layer structure.

Current efficiency of the organic electroluminescent devices according to the Embodiment and Comparative Embodiment is compared and summarized in Table 1 below. For current efficiency, current efficiency of the organic electroluminescent devices at operation was measured under the current density condition of 10 mA/cm².

TABLE 1

|  | Red | | Green | | Blue | |
| --- | --- | --- | --- | --- | --- | --- |
|  | R_CIE_x | R efficiency | G_CIE_x | G efficiency | B_CIE_y | B efficiency |
| Embodiment | 0.676 | 37.6 | 0.216 | 50.7 | 0.054 | 89.3 |
| Comparative Embodiment | 0.676 | 36.9 | 0.221 | 49.9 | 0.060 | 87.6 |

Referring to Table 1 above, it may be that efficiency of the Embodiment was superior to that of the Comparative Embodiment.

Figure 5:
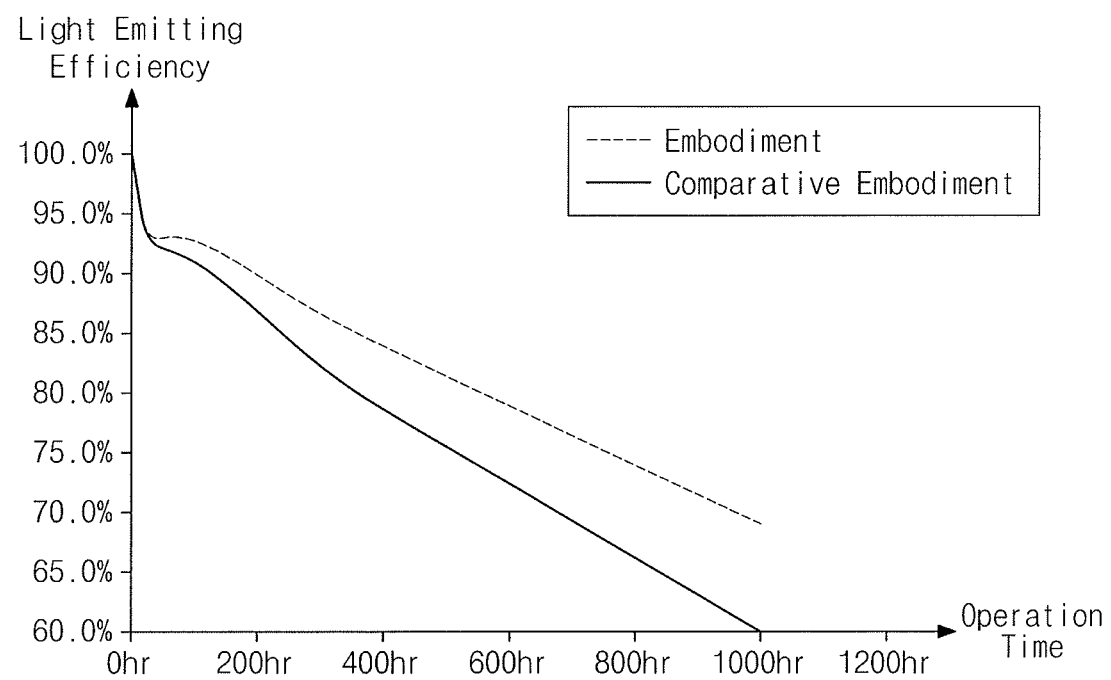
FIG. 5 illustrates a graph schematically comparing lifespan of organic electroluminescent devices according to an embodiment and comparative embodiment.

Lifespan of the organic electroluminescent devices according to the Embodiment and Comparative Embodiment were compared and are shown in FIG. 5. Referring to FIG. 5, it may be seen that lifespan of the organic electroluminescent device according to the Embodiment is increased relative to that of the Comparative Embodiment. More specifically, although degrees of lifespan reduction are similar in both organic electroluminescent devices according to the Embodiment and Comparative Embodiment until the initial about 20 hours, after then, degrees of lifespan reduction are different. Based on lifespan of 1000 hours, it may be seen that lifespan of the organic electroluminescent device according to Embodiment was longer in about at least 10% than that of the organic electroluminescent device according to Comparative Embodiment.

According to an embodiment, the organic electroluminescent device may extend lifespan.

According to an embodiment, the organic electroluminescent display may extend lifespan.

The embodiments may provide an organic electroluminescent device having high efficiency and long lifespan.

The embodiments may provide an organic electroluminescent display having high efficiency and long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic electroluminescent device, comprising:
   a first electrode;
   a second electrode on the first electrode;
   an emission layer between the first electrode and the second electrode;
   an electron transport layer between the emission layer and the second electrode, and
   a hole blocking layer between the emission layer and the electron transport layer,
   wherein the electron transport layer including:
      a first electron transport layer on the hole blocking layer;
      a second electron transport layer on the first electron transport layer; and
      a third electron transport layer on the second electron transport layer,
   wherein:
      the first electron transport layer includes a first electron transport material and has a first thickness x1,
      the second electron transport layer includes the first electron transport material, a second electron transport material, and a third electron transport material and has a second thickness x2,
      the third electron transport layer includes the second electron transport material and the third electron transport material and has a third thickness x3,
      the first electron transport layer, the second electron transport layer, and the third electron transport layer satisfy Formula 2 below:

$x3 > x1 > x2$,        Formula 2:

the first electron transport material is a compound that includes a carbazole group and a triazine group, the second electron transport material is a compound that includes a benzoquinoline group and a phosphine oxide group, and the third electron transport material is one of LiQ, LiF, $Li_2O$, CsF, BaF, BaO, $Al_2O_3$, NaCl, RbCl, RbI, Ca, Cs, and Yb,
      a weight ratio of the second electron transport material and the third electron transport material included in the third electron transport layer is 4:6 to 6:4.

2. The organic electroluminescent device as claimed in claim 1, wherein the first electron transport material is Compound 1 below:

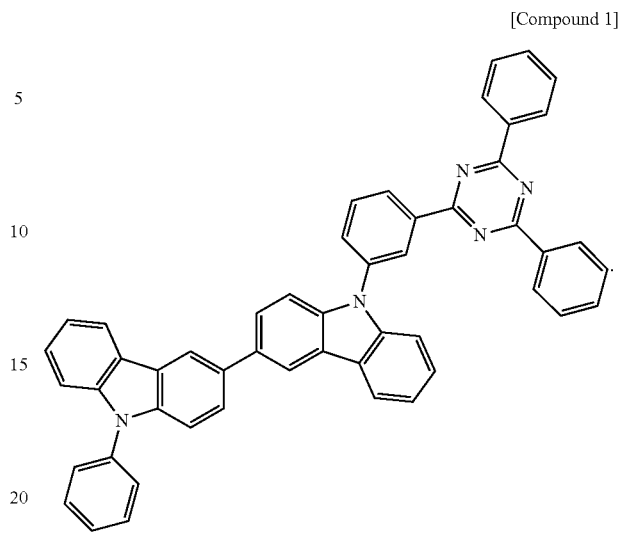

[Compound 1]

3. The organic electroluminescent device as claimed in claim 1, wherein the second electron transport material is Compound 2 below:

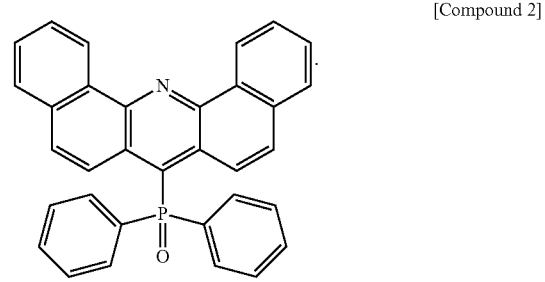 [SMILES: O=P(c1ccccc1)(c1ccccc1)c1c2ccc3ccccc3c2nc2c1ccc1ccccc12]

[Compound 2]

4. The organic electroluminescent device as claimed in claim 1, wherein the first electron transport material and the second electron transport material are selected such that Formula 1 below is satisfied:

$[T1-T2] > 0.4$ eV        Formula 1:

wherein:
T1 is an energy level of a highest occupied molecular orbital of the first electron transport material, and
T2 is an energy level of a highest occupied molecular orbital of the second electron transport material.

5. The organic electroluminescent device as claimed in claim 1, wherein the electron transport layer satisfies Formula 3 below:

$10 < [X1/Y1] \times 100 < 15$        Formula 3:

wherein:
X1 is a total thickness of the electron transport layer, and
Y1 is a distance between the first electrode and the second electrode.

6. The organic electroluminescent device as claimed in claim 1, wherein the first thickness x1 of the first electron transport layer is about 10% to about 20% of a total thickness of the electron transport layer.

7. The organic electroluminescent device as claimed in claim 1, wherein the second thickness x2 of the second electron transport layer is about 1% to about 6% of a total thickness of the electron transport layer.

8. The organic electroluminescent device as claimed in claim 1, wherein:
one face of the first electron transport layer contacts one face of the emission layer,
another face of the first electron transport layer contacts one face of the second electron transport layer, and
another face of the second electron transport layer contacts one face of the third electron transport layer.

9. The organic electroluminescent device as claimed in claim 1, further comprising a hole transport region between the first electrode and the emission layer, wherein the hole transport region includes:
a first hole transport layer on the first electrode; and
a second hole transport layer on the first hole transport layer.

10. The organic electroluminescent device as claimed in claim 9, wherein the first hole transport layer includes a p-type dopant.

11. The organic electroluminescent device as claimed in claim 1, wherein the emission layer includes:
a first emission layer on the first electrode;
a second emission layer on the first emission layer; and
a third emission layer on the second emission layer.

12. The organic electroluminescent device as claimed in claim 1, wherein:
the first thickness x1 is 40 Å to 60 Å,
the second thickness x2 is 3 Å to 20 Å, and
the third thickness x3 is 250 Å to 350 Å.

13. An organic electroluminescent display, comprising a plurality of pixels, wherein each pixel includes:
a first electrode;
an emission layer on the first electrode;
a hole blocking layer on the emission layer;
a first electron transport layer on the hole blocking layer, the first electron transport layer including a first electron transport material and having a first thickness x1;
a second electron transport layer on the first electron transport layer, the second electron transport layer including the first electron transport material, a second electron transport material, and a third electron transport material and having a second thickness x2;
a third electron transport layer on the second electron transport layer, the third electron transport layer including the second electron transport material and the third electron transport material and having a third thickness x3; and
a second electrode on the third electron transport layer, and
wherein the first electron transport material, the second electron transport material and the third electron transport material are different from one another, and
wherein the first electron transport layer, the second electron transport layer, and the third electron transport layer satisfy Formula 2 below:

$x3 > x1 > x2$, and     Formula 2:

wherein:
the first electron transport material is a compound that includes a carbazole group and a triazine group,
the second electron transport material is a compound that includes a benzoquinoline group and a phosphine oxide group,
the third electron transport material is one of LiQ, LiF, $Li_2O$, CsF, BaF, BaO, $Al_2O_3$, NaCl, RbCl, RbI, Ca, Cs, and Yb, and a weight ratio of the second electron transport material and the third electron transport material included in the third electron transport layer is 4:6 to 6:4.

14. The organic electroluminescent display as claimed in claim 13, wherein the second thickness x2 of the second electron transport layer is about 1% to about 6% of a total thickness of the electron transport layer.

15. The organic electroluminescent display as claimed in claim 13, wherein:
the first thickness x1 is 40 Å to 60 Å,
the second thickness x2 is 3 Å to 20 Å, and
the third thickness x3 is 250 Å to 350 Å.

16. An organic electroluminescent display comprising a plurality of pixels, wherein each pixel includes:
a first electrode;
an emission layer on the first electrode;
a hole blocking layer on the emission layer;
a first electron transport layer on the hole blocking layer, the first electron transport layer including a first electron transport material and having a first thickness x1;
a second electron transport layer on the first electron transport layer, the second electron transport layer including the first electron transport material, a second electron transport material, and a third electron transport material and having a second thickness x2;
a third electron transport layer on the second electron transport layer, the third electron transport layer including the second electron transport material and the third electron transport material and having a third thickness x3; and
a second electrode on the third electron transport layer, and
wherein the first electron transport layer, the second electron transport layer, and the third electron transport layer satisfy Formula 2 below:

$x3 > x1 > x2$, and     Formula 2:

the first electron transport material is Compound 1 below,

[Compound 1]

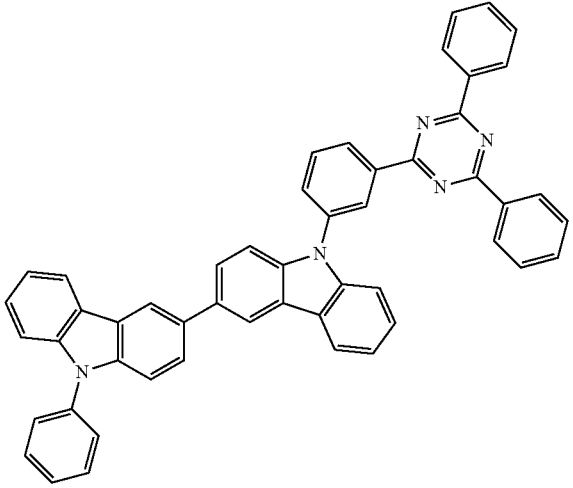

the second electron transport material is Compound 2 below,

[Compound 2]
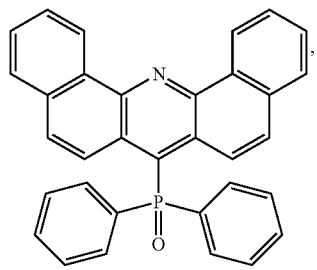
and
the third electron transport material is LiQ.
* * * * *